US008581586B2

(12) United States Patent
Abe et al.

(10) Patent No.: US 8,581,586 B2
(45) Date of Patent: Nov. 12, 2013

(54) METHOD OF CALCULATING COIL PATTERN, AND GRADIENT MAGNETIC FIELD COIL

(75) Inventors: Mitsushi Abe, Tokyo (JP); Hirotaka Takeshima, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 485 days.

(21) Appl. No.: 12/933,255

(22) PCT Filed: Mar. 27, 2009

(86) PCT No.: PCT/JP2009/056374
§ 371 (c)(1),
(2), (4) Date: Sep. 17, 2010

(87) PCT Pub. No.: WO2009/119837
PCT Pub. Date: Oct. 1, 2009

(65) Prior Publication Data
US 2011/0018540 A1     Jan. 27, 2011

(30) Foreign Application Priority Data
Mar. 28, 2008   (JP) ................................. 2008-087862

(51) Int. Cl.
*G01V 3/00*     (2006.01)
(52) U.S. Cl.
USPC ........................................................ 324/318
(58) Field of Classification Search
USPC .............................................. 324/300–322
See application file for complete search history.

(56) References Cited

U.S. PATENT DOCUMENTS

| 7,362,101 B2 * | 4/2008 | Muftuler et al. ............. 324/318 |
| 2002/0135368 A1 | 9/2002 | Goto et al. |
| 2012/0235685 A1 * | 9/2012 | Abe ............................. 324/322 |

FOREIGN PATENT DOCUMENTS

| JP | 2-218346 | 8/1990 |
| JP | 6-14900 | 1/1994 |
| JP | 2001-413 | 1/2001 |

OTHER PUBLICATIONS

International Search Report in PCT/JP2009/056374, 2009.

* cited by examiner

*Primary Examiner* — Dixomara Vargas
(74) *Attorney, Agent, or Firm* — Cooper & Dunham LLP

(57) ABSTRACT

A coil pattern calculation method includes calculating a current potential at each contact between finite surface elements forming each of the coil surfaces based on an initial value of an input current potential distribution, and, for each of the coil surfaces, repeatedly calculating the current potential alternately and, under each magnetic field condition, determining a current potential distribution that generates a magnetic field falling within the range of allowable error for each target magnetic field so that a surface current represented by the current potential will become close to a target magnetic field distribution set for each of the finite surface elements; and determining a coil pattern from the contour lines of the determined current potential distribution.

13 Claims, 15 Drawing Sheets (a)

(b)

(a)

(b)

METHOD OF CALCULATING COIL PATTERN, AND GRADIENT MAGNETIC FIELD COIL

TECHNICAL FIELD

The present invention relates to a coil pattern calculation method and a gradient magnetic field coil.

BACKGROUND ART

In diagnostics utilizing nuclear magnetic resonance, magnetic field strength corresponds to a place to be diagnosed. Accordingly, the accuracy required for the strength of the magnetic field generated by a magnet system is on the order of one millionth of the magnetic field strength. By the way, the magnetic fields relating to a nuclear magnetic resonance imaging apparatus (hereinafter referred to as "MRI apparatus") is broadly divided into three types as follows:

(1) Static magnetic field that is temporally stationary and spatially constant, the strength of which is typically 0.1 or several teslas or more. This static magnetic field varies only within the range of a few ppm in a space in which imaging is performed (typically a spherical or ellipsoidal space with a diameter of 30 or 40 cm or so, herein referred to as "imaging field").

(2) A gradient magnetic field that is varied with a time constant of about one second or less and is spatially tilted.

(3) A magnetic field generated by a high-frequency electromagnetic wave with a frequency corresponding to nuclear magnetic resonance (a several MHz or higher).

The static magnetic field spatially constant and temporally stationary of (1) described above is typically generated by a permanent magnet or a coil in which current flows. This static magnetic field can also be more homogeneous by magnetizing magnetic substances appropriately disposed.

The gradient magnetic field of (2) described above is generated by a coil in which temporally varying current flows (hereinafter referred to as "gradient magnetic field coil"). The frequency of the applied nuclear magnetic resonance of (3) described above is associated with the position of the nuclear magnetic resonance by applying gradient magnetic field. This gradient magnetic field cannot be generated by only a coil having a simple circular pattern of conductor.

A coil that generates the gradient magnetic field of (2) described above has a shape of a saddle and a complicated pattern of wiring passing between parallel surfaces (i.e., a three-dimensional wiring), as described on Patent Document 1. In order to determine such a complicated pattern for a target magnetic field, a method for calculating a coil pattern that generates the target magnetic field. Also, what coil pattern can be designed depends on what method is used for calculating the coil pattern.

In the example of conventional art described above, the surface on which a coil pattern is arranged is represented by a combination of square finite surface elements F, as shown in FIG. 14(a). As shown by arrows indicating rotation directions in this figure, currents are considered that circulate within the respective finite surface elements, and the magnitude of each current is determined so that the target magnetic field can be reproduced. The current flowing in each side is determined from the difference of currents circulating adjacent finite surface elements F. Consequently, the whole current flow can be represented by lines as schematically shown in FIG. 14(b). However, this method has problems as follows:

(2-1) Net Current that Flows in a Hollow Ring-Shaped Surface Cannot be Represented.

Although current that flows as eddy current can be represented, current that flows in one direction as a whole cannot be represented. For example, in a cylindrical system as shown in FIG. 15, net current that flows in a circling direction cannot be represented using this conventional method. This is because the conventional art example assumes that no net current exists in currents circulating within the respective square elements. According to this assumption, in order to simulate current in the circling direction, current in the reverse direction needs to be added somewhere. Or a surface with no hole needs to be a calculation surface.

(2-2) A Fabricatable Coil Pattern Cannot be Determined.

In the current pattern of the conventional art example, the portion of the current pattern flowing between a top surface F1 and a bottom surface F2 in FIG. 14(b) needs conductive connections, in which the coil pattern would be desirably linear, but the conventional art example only allows a curved coil pattern. Also, by the same reason as (2-1), a coil pattern in which the conductive connections are disposed centered to a certain area cannot be designed.

(2-3) Calculation with Incoming/Outgoing Currents Considered is Impossible.

Since only circulating currents are assumed, an incoming point at which current flows into the surface and an outgoing point at which current flows out of the surface, which may exist in an actual pattern, cannot be represented. This is because, in the gradient magnetic field coil (GC) including the combination of two surfaces shown in FIG. 14(b), both the surfaces need to be calculated at one time to determine the coil pattern. This makes it difficult to support at the same time the shielding capability with a required accuracy of an error magnetic field of 0.1 gauss or less and the gradient magnetic field of imaging field allowing an error magnetic field of several gausses, resulting in a useless pattern.

(2-4) Difference in Magnetic Field Accuracy Between Regions Cannot be Reflected in the Calculation.

Difference in required magnetic field performance between the top surface F1 and the bottom surface F2 cannot be reflected in the calculation, resulting in the problem as described above.

Due to the limitation of this method, in the conventional art example, the conductive connections between the top surface F1 and the bottom surface F2 are curved and swollen as shown in FIG. 14(b). This makes the fabrication difficult. Also, when the whole system is not cylindrical but, for example, in the shape in which a hole exists in a curved surface, such as a pot-like shape, the pattern is limited (in the case of (2-1), net current cannot be represented). This makes it difficult to achieve target performance and to fabricate the coil.

Patent Document 1: U.S. Pat. No. 5,309,107

BRIEF SUMMARY

This disclosure provides a coil pattern calculation method and a gradient magnetic field coil that can eliminate the limitation of coil pattern design as described above, facilitate the fabrication, and improve the accuracy of magnetic field.

According to the invention, a coil pattern calculation method and a gradient magnetic field coil are provided which can eliminate the limitation of coil pattern design, facilitate the fabrication, and improve the accuracy of magnetic field.

DESCRIPTION OF REFERENCE NUMERALS AND SIGNS

1 gradient magnetic field coil, 1' gradient magnetic field coil, 2 main gradient magnetic field coil, 2' main gradient magnetic field coil, 3 gradient magnetic field shield coil, 3' gradient magnetic field shield coil, 7 connecting part, 10 imaging field, 11 calculation model, 12 main gradient magnetic field coil calculation model, 13 gradient magnetic field shield coil calculation model, 16 current potential contour lines, 17 calculation model, 100 CPU, 101 input unit, 102 calculation processing unit, 102A creating unit, 102B processing unit, 102D target magnetic field setting unit, 102E magnetic field evaluating unit, 102F target performance determining unit, 103 storage unit, 104 output unit

DETAILED DESCRIPTION OF EMBODIMENTS

As described above, the limitation of coil pattern due to a methodological problem is due to that the method is based on finite surface elements within each of which circulating current flows. In view of this, a current potential is given to each contact between finite surface elements, and a current potential distribution of the contacts is determined so that a target magnetic field distribution B is approximated by a current potential vector T including the current potential as element. A current density vector is expressed by the vector product of the gradient of the current potential and the normal to the current surface. This approximate solution utilizes a method of applying singular value decomposition. Thus, a gradient magnetic field coil having a coil pattern that can eliminate the limitation of coil pattern design, facilitate the fabrication, and improve the accuracy of magnetic field can be obtained.

Figure 1:
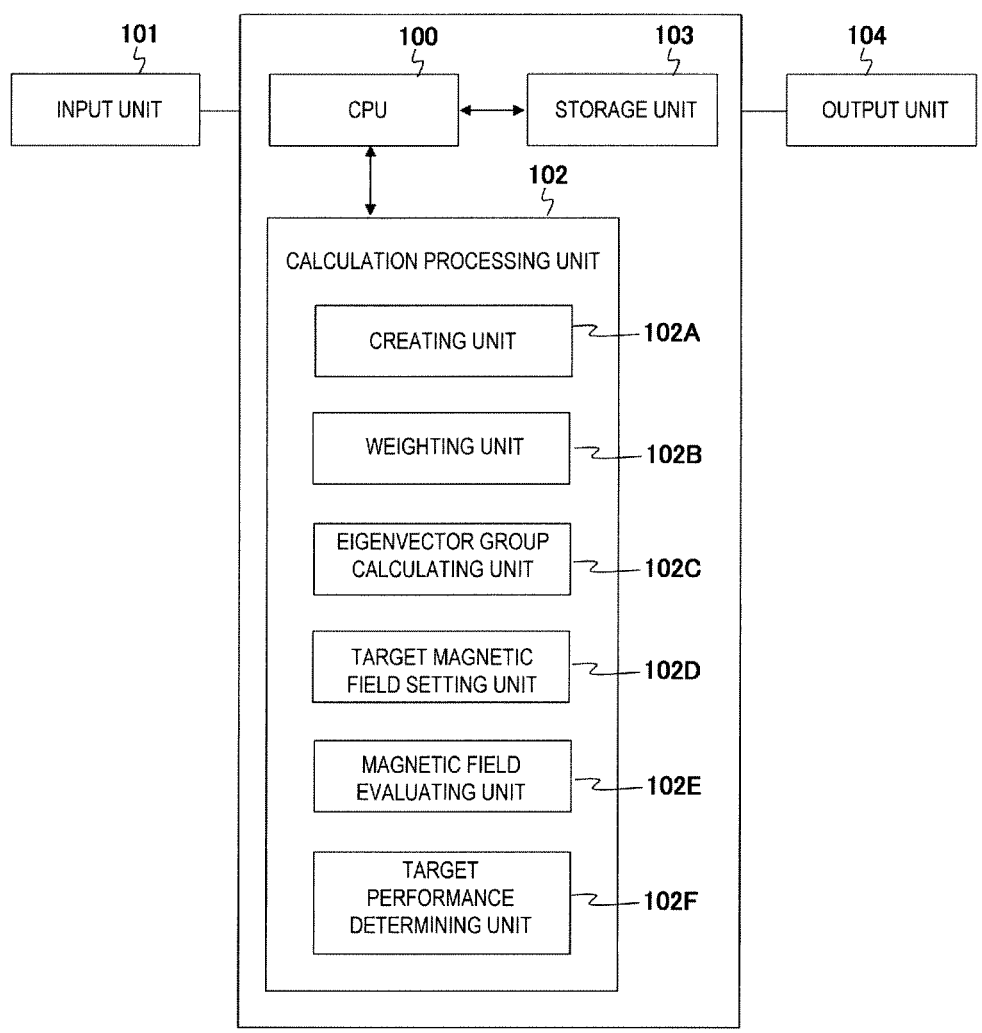
FIG. 1 A schematic configuration diagram of an calculation apparatus that implements a coil pattern calculation method in accordance with an embodiment of the invention.

FIG. 1 shows a schematic configuration of a coil pattern calculation apparatus that implements a coil pattern calculation method in accordance with an embodiment of the invention. As shown in FIG. 1, the coil pattern calculation apparatus that implements the coil pattern calculation method in accordance with the embodiment includes: a CPU 100 for controlling an entire system; an input unit 101; a calculation processing unit 102 for calculating a coil pattern under the control of the CPU 100; a storage unit 103 connected to the calculation processing unit 102; and an output unit 104 for outputting data calculated by the calculation processing unit 102.

The input unit 101, such as keyboard or mouse, inputs data to the calculation processing unit 102 and/or the storage unit 103.

The output unit 104, such as liquid crystal display, displays data calculated by the calculation processing unit 102 and/or data stored in the storage unit 103. The output unit 104 also outputs numerical or other data for precisely designing the structure of a gradient magnetic field coil.

The calculation processing unit 102 generally includes: a creating unit 102A; a weighting unit 102B; an eigenvector group calculating unit 102C using singular value decomposition; a target magnetic field setting unit 102D; a magnetic field evaluating unit 102E; and a target performance determining unit 102F for determining whether the magnetic field has achieved the target performance or not.

Figure 3:
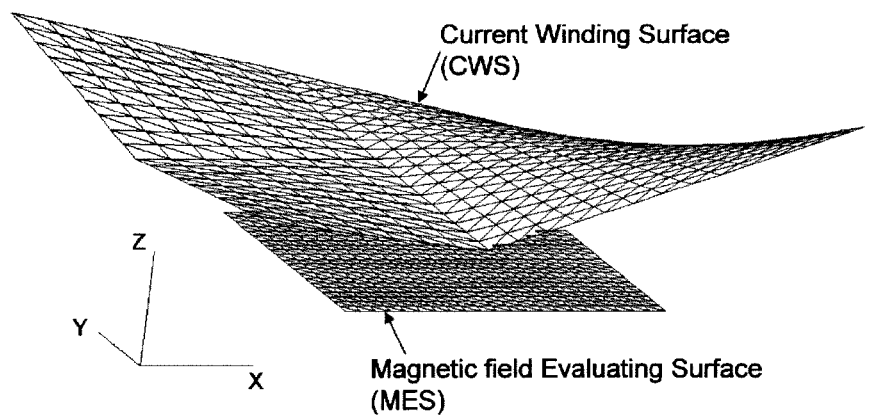
FIG. 3 A diagram for describing a typical calculation system.

Based on data input from the input unit 101 and/or data or a formula stored in the storage unit 103, the creating unit 102A creates a calculation system data for representing a surface on which a coil is planned as a set of triangular finite elements (finite surface elements) (see FIG. 3). The creating unit 102A also determines a point (location) at which the magnetic field is to be evaluated.

The weighting unit 102B performs weighting on the target magnetic field using method of least squares, which is a processing for determining a magnetic field falling within the allowable error range of the target magnetic field. The eigenvector group calculating unit 102C adds a constraint condition on a contact to a matrix of the number of magnetic field evaluating points and the number of contacts to produce a response matrix from the current potential of an independent contact to the magnetic field evaluating point, and performs singular value decomposition on the response matrix to obtain a set of magnetic field distribution and current potential eigen distribution function (eigenvector group).

The target magnetic field setting unit 102D sets the target magnetic field for designing the coil pattern. Specifically, the target magnetic field setting unit 102D sets an initial value of magnetic field and determines the difference between the initial value and a desired magnetic field. Then the target magnetic field setting unit 102D determines an approximate value of the current potential distribution of an independent contact at which the difference occurs. Then the target magnetic field setting unit 102D determines the magnetic field distribution (coefficient) generated from the distribution of the approximate value so that the difference between the magnetic field and the target magnetic field distribution is decreased depending on the requirement of magnetic field accuracy. This is the same as the case of using method of least squares except that the coefficient is determined by the inner product of an eigen magnetic field distribution and the target magnetic field distribution.

The magnetic field evaluating unit 102E evaluates whether or not the determined current potential distribution has achieved the target magnetic field performance. The target performance determining unit 102F determines whether or not a magnetic field generated by an actual wiring pattern formed based on the determined current potential distribution has achieved the target performance.

Next, a basic calculation process performed by a calculation apparatus configured as described above is described with reference to a flowchart shown in FIG. 2.

(3-1) First, the creating unit 102A creates a calculation system data (step S1). This system is typically a system as shown in FIG. 3. Here, a surface on which a coil is planned (CWS: Current Winding Surface) is represented as a set of triangular finite surface elements. At the same time, the creating unit 102A also determines a point at which the magnetic field is to be evaluated. The point at which the magnetic field is to be evaluated (magnetic field evaluating point) does not need to constitute a surface. However, in FIG. 3, the point (not shown) is disposed on a surface (MES: Magnetic field Evaluating Surface) shown at the bottom.

(3-2) A target magnetic field and its weight (allowable error) data input via the input unit 101 or stored in the storage unit 103 in advance are read and input to the calculation processing unit 102 (step S2). This weight corresponds to an error of measurement data when processing experiment data using method of least squares.

(3-3) Next, the eigenvector group calculating unit 102C obtains an eigenvector group by producing a response matrix from a gradient magnetic field coil to the magnetic field and performing singular value decomposition on the response matrix (step S3). First, under the above-described condition, the following equation is constructed:

$$B = AT \quad (1).$$

This equation gives a response from a current potential vector T including as element a current potential value of a contact on a current surface to the magnetic field at the magnetic field evaluating point. A matrix A has m (number of magnetic field evaluating points) rows by n (number of contacts) columns. The current potential vector can be converted to the current density by the vector product of its gradient and the normal to its surface, allowing the current distribution to be calculated. Once the current distribution is determined, the magnetic field can be easily calculated using Biot-Savart's equation.

A constraint condition on the contact is added to the matrix A to produce a response matrix A' from the current potential of an independent contact to the magnetic field evaluating point. Then, singular value decomposition is performed on the matrix A' to obtain a set of magnetic field distribution and current potential eigen distribution function (eigenvector group). Thus, the relation between the current potential vector T of all contacts and a current potential vector T' of independent contacts can be expressed as follows:

$$T = RT' \quad (2)$$

where R is a matrix of magnitudes of the number of all contacts and the number of independent contacts. If all contacts are independent, R is nothing more or less than a unit matrix. However, for an actual system, under the condition that current do not leak out from edges, the condition that all current potentials of contacts located at the edges need to be the same and any other condition exist, so R would be a non-square matrix. Considering the equation (2), the equation (1) can be rewritten as follows:

$$B = ART' \quad (3), \text{ and}$$

$$A' = AR \quad (4).$$

If the eigen distributions of the magnetic field distribution obtained through singular value decomposition is:

$$u_1, u_2, u_3 \quad (5)$$

and if the eigen distributions of the current potential is:

$$v1, v2, v3 \quad (6),$$

the relation between $u_j$ and $v_j$ is as follows:

$$\lambda_j \cdot u_j = A' \cdot v_j$$

where $\lambda_j$ is a singular value. The subscript j is an ordering number attached to the eigen distributions in the order of increasing singular value.

(3-4) The target magnetic field setting unit 102D inputs an initial current potential distribution and sets an initial condition (step S4).

(3-5) Also, the target magnetic field setting unit 102D determines an initial value $T_0$ of the current potential (step S5).

(3-6) Then, the target magnetic field setting unit 102D sets an initial value of the magnetic field to $$B_0 = AT_0 \quad (7),$$

and determines a difference $B_1$ between the initial value and a desired magnetic field, and then sets a target magnetic field for planning a coil (step S6):

$$B_1 = B_{tg} - B_0 \quad (8).$$

(3-7) Here, an approximate value $T_1'$ of the current potential distribution of the independent contact that generates $B_1$ is determined by $$T_1' = C_1 v_1 + C_2 v_2 + C_3 v_3 \quad (9),$$

and corrects a coil current potential (step S7). A coefficient $C_k$ is determined as follows. Basically, $C_k$ is a magnetic field distribution generated by the $T_1$ distribution and is determined so that the difference between the magnetic field ($=AT_1$) and a target magnetic field distribution $B_{tg}$ stored in the storage unit 103 is minimized. This is the same as the case of using method of least squares except that $C_k$ is determined by the inner product of an eigen magnetic field distribution and the target magnetic field distribution $B_{tg}$ as follows:

$$C_k = (B_1 \cdot u_k)/\lambda_k \quad (10).$$

$C_k$ may be adjusted if needed, for example, according to a required magnetic field accuracy. In the equation (9), addition of the first to third eigen distributions is shown as an example. When increasing the number of eigen distributions, the solution approaches to that by method of least squares.

(3-8) Then, the current potential distribution T that generates the target magnetic field distribution $B_{tg}$ is determined by $$T = T_0 + RT_1' \quad (11).$$

The contour lines of this current potential distribution correspond to the shape of the desired coil pattern.

(3-9) The magnetic field evaluating unit 102E evaluates whether or not the current potential distribution T determined by the equation (11) has achieved the target magnetic field performance (step S8). If determined that the current potential distribution has achieved the target magnetic field performance (Yes in step S8), the process proceeds to step S9 where a discretized actual wiring pattern is formed according to a power supply current. On the other hand, if determined that the target magnetic field performance has not been achieved (No in step S8), the process repeats steps S4 through S8.

(3-10) Then, the target performance determining unit 102F evaluates whether or not the actual wiring pattern formed in step S9 has achieved the target magnetic field performance (step S10). If determined that the actual wiring pattern has achieved the target magnetic held performance (Yes in step S10), the calculation process ends. On the other hand, if determined that the target magnetic field performance has not been achieved (No in step S10), the process proceeds from step 7 to step S9 to form new wiring pattern according to a power supply current. Note that, if No in steps S8 or S10, steps S2 through S7 may be repeated or steps S1 through S7 may be repeated as appropriate.

Since this method is not based on circulating current, any current distribution can be calculated as long as element size allows. Although weight of magnetic field distribution (allowable error) has not been mentioned above, introducing the weight is equivalent to performing variable transformation of data of individual points of magnetic field distribution. Specifically, the magnetic field of the equations (1) and (3) is the difference determined by the equation (8), and the weight of its component can be considered as follows:

$$B_i \rightarrow B_i/w_i \qquad (12)$$

where the subscript i indicates the i-th element of the magnetic field distribution vector. $w_i$ is the weight (allowable error) of the i-th magnetic field data. Smaller value needs to be more accurately approximated, as approximation using method of least squares.

Figure 2:
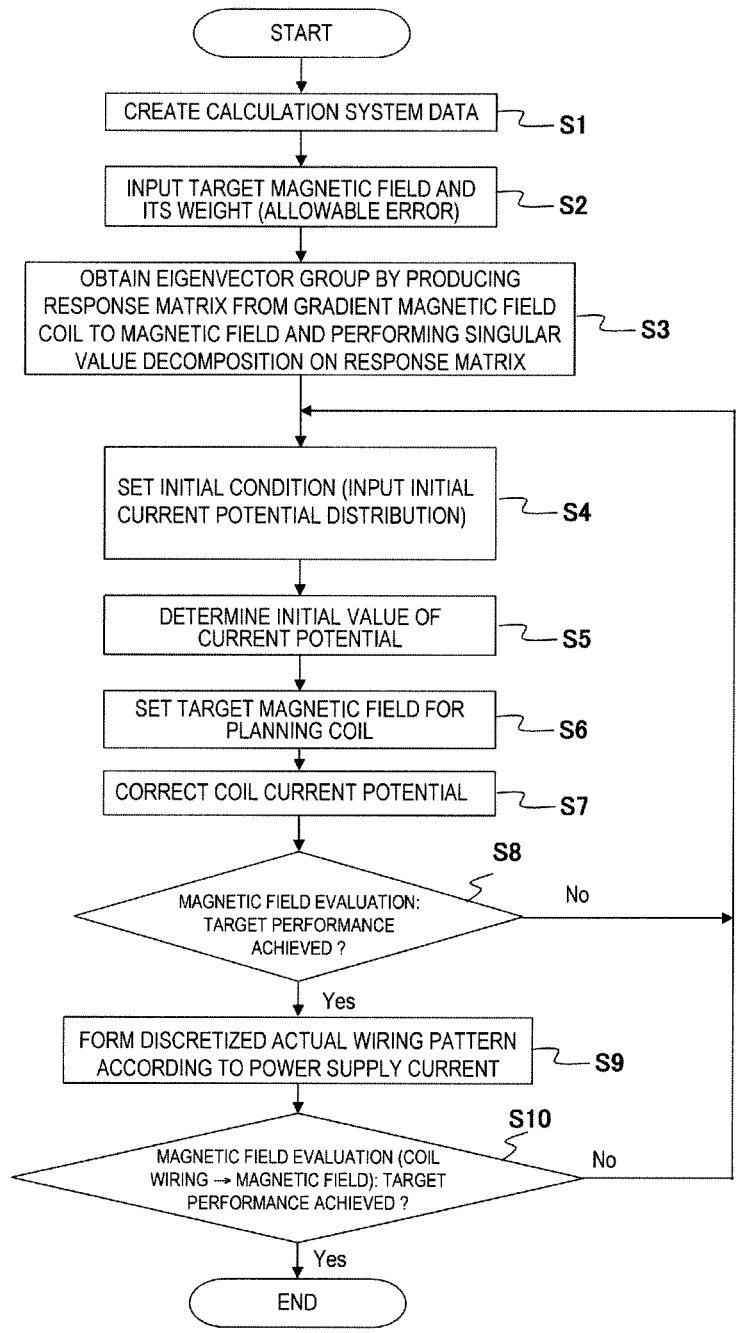
FIG. 2 A flowchart for describing a process of the coil pattern calculation method.

The flowchart shown in FIG. 2 shows the function of the eigenvector group calculating unit 102C of obtaining the response matrix from the gradient magnetic field coil to the magnetic field and obtaining the eigenvector group by performing singular value decomposition on the response matrix (step S3) as serial operation. However, this function is practically performed in parallel with steps S4 through S7, and is shown for convenience as one operation of the serially performed operations.

Then, in the embodiment of the invention, a characteristic calculation method as described below is introduced to the calculation method described above.

(4-1) First, weight is introduced through calculation of the current potential of the contact.

The weight is considered using variable transformation, as the equation (12). Specifically, the weight of the current potential of the equation (1) can be considered as follows:

$$T_i \rightarrow T_i/w_{Ti} \qquad (13).$$

The weight for the independent contact is determined by adding the weight for the dependent contact considering the area of the corresponding element. $w_{Ti}$ can be considered as an amount proportional to an allowable range of fluctuation. For a small value, the range of fluctuation in the repeated calculation is suppressed. Specifically, if the pattern needs to be fixed to that with the current potential of $T_0$, a small $w_{Ti}$ is allocated to the appropriate area. Considering $w_{Ti}$ as weight, a larger value corresponds to a larger range of fluctuation and a larger weight. On the other hand, a smaller $w_i$ requires more accurate approximation of the magnetic field, in which, in normal sense of weight, a smaller $w_i$ has a larger weight. Such difference in real meaning exists.

(4-2) Next, outgoing/incoming of current is introduced to the calculation.

Figure 4:
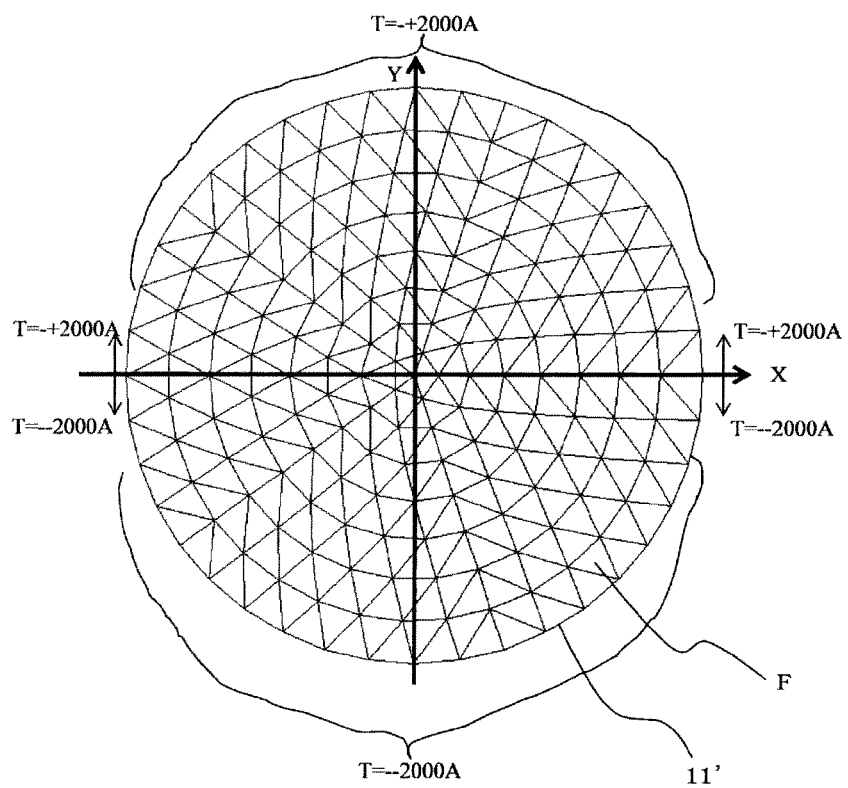
FIG. 4 A diagram for describing a setting of a current potential value corresponding to outgoing/incoming.

Current is represented by the difference of current potentials. As an initial value of current, a difference of current potentials corresponding to outgoing/incoming current is input to an incoming/outgoing point. A current potential distribution corresponding to this incoming/outgoing is input to a contact as an edge. As an internal setting, a current potential distribution seamlessly continuing from this input current potential distribution is input. FIG. 4 shows an example of this. In FIG. 4, a calculation model 11' simulating a gradient magnetic field coil is formed of finite surface elements F. Near the X-axis, a current of 4 kA (2000 A+2000 A) is coming in from the left, and a current of 4 kA (2000 A+2000 A) is going out to the right. In the calculation of the correction $T_1'$ described above, the calculation is performed under the condition without incoming/outgoing current, and incoming/outgoing current input as an initial value is preserved. An example of input in an actual calculation is described later.

(4-3) An region for the calculation is divided into subregions, and a step of alternately calculating a coil pattern for the subregions is repeated until convergence.

Figure 5:
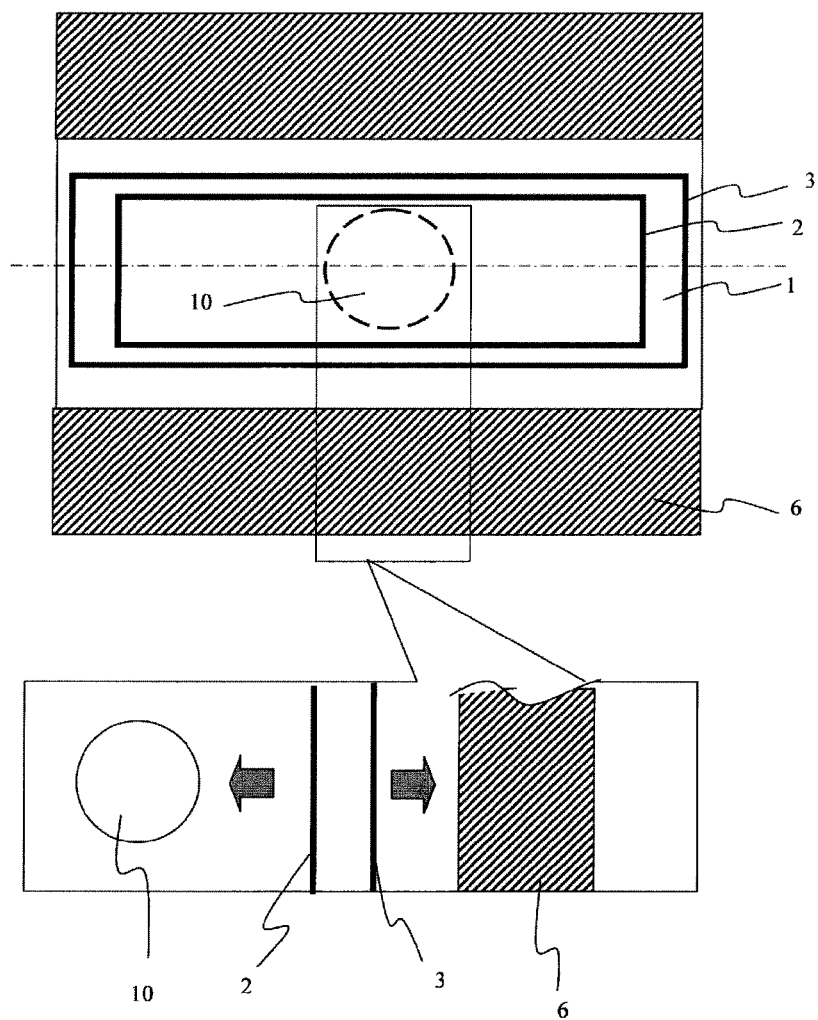
FIG. 5 A conceptual diagram showing an application to a gradient magnetic field coil for a horizontal magnetic field MRI apparatus.

Referring to FIG. 5, as an example, a gradient magnetic field coil 1 combined with a magnet 6 used for a horizontal magnetic field type MRI apparatus is described. The region of a coil pattern is divided to two subregions, a cylindrical main gradient magnetic field coil 2 and a gradient magnetic field shield coil 3. Then, among the steps described with reference to the equations (1) through (12) and FIG. 2, step S4 (setting an initial condition) through step S7 (correcting a coil current potential, $T=T_0+T_1'$) are calculated for each region, and repeated until convergence.

In FIG. 5, as shown by arrows in the lower part of the figure, for the main gradient magnetic field coil 2, a coil pattern is determined so that the magnetic field of a imaging field 10 is formed, and for the gradient magnetic field shield coil 3, a coil pattern is determined so that the magnetic field leaking out into the magnet is eliminated. Which magnetic field the coil pattern is determined for depends on the weight in the equation (12). In the repeated calculation, when the coil pattern of the gradient magnetic field shield coil 3 is determined, $w_i$ is set to be large for the magnetic field evaluation point of the imaging field 10, or the magnetic field evaluation point of the imaging field 10 is excluded from the target magnetic field evaluating point.

On the other hand, when the coil pattern of the main gradient magnetic field coil 2 is determined, $w_i$ is set to be large for the magnetic field evaluation point of the leakage into the magnet, or the magnetic field evaluation point of the leakage into the magnet is excluded from the target magnetic field evaluating point. Also, for the weight $w_{Ti}$ for the current potential, a similar weighting is performed.

A calculation process performed by a calculation apparatus using such a characteristic calculation method is described with reference to a flowchart shown in FIG. 6, focusing the difference from the flowchart in FIG. 2.

This coil pattern calculation method assumes that the gradient magnetic field coil 1 is divided into two subregions and is characterized by: calculating two eigenvector groups obtained by performing two sets of singular value decomposition on the main gradient magnetic field coil 2 and the gradient magnetic field shield coil 3 (steps S31, S32); performing correction on the current potential distribution in the two subregions (steps S7', S7''); performing the repeated calculation until the current potential distribution converges (step S71); and setting the weights (step S11, S2).

Specifically, data of contact weight (allowable error and range of fluctuation) input via the input unit 101 or stored in the storage unit 103 in advance is input to the calculation processing unit 102 (step S11); the eigenvector group calculating unit 102C obtains eigenvector groups by producing response matrixes from the main gradient magnetic field coil 2 and the gradient magnetic field shield coil 3 to the magnetic field and performing singular value decomposition on the response matrixes (step S31, S32); and the target magnetic field setting unit 102D inputs an initial current potential distribution as well as incoming/outgoing and sets an initial condition (step S4').

Then, an initial value of the current potential of the i-th calculation is determined (step S5'), and a target magnetic field for planning the main gradient magnetic field coil 2 of the i-th calculation is set (step S6'). Then, the main gradient magnetic field coil current potential is corrected (step S61), and the current potential corrected for the main gradient magnetic field coil 2 is obtained (step S7').

Then, as an alternately performed calculation, a target magnetic field for planning the gradient magnetic field shield coil 3 of the i-th calculation is set (step S6"), and the current potential corrected for the gradient magnetic field shield coil 3 is obtained (step S7").

Then, the process proceeds to step S71 where it is determined whether the current potential distribution has converged or not. If determined that the current potential distribution has converged (Yes in step S71), the process performs steps S8 through S10 as described earlier. In step S10, if determined that the actual wiring pattern has achieved the target magnetic field performance (Yes in step S10), the process ends.

On the other hand, in step S71, if determined that the current potential distribution has not converged (No in step S71), i is incremented by 1 (step S71') and then steps S5' through S71 are repeated.

Figure 7:
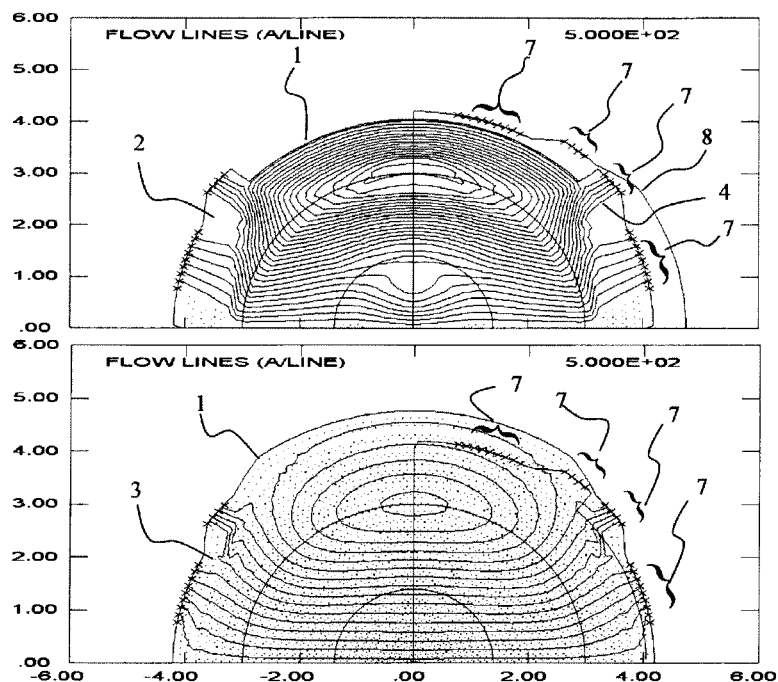
FIG. 7 A diagram showing a current potential of the gradient magnetic field coil calculated using the coil pattern calculation method in accordance with an embodiment of the invention, represented by contour lines.

FIG. 7 shows an example of a plate type gradient magnetic field coil calculated using this coil pattern calculation method. In FIG. 7, one quarter of the entire system is calculated and a center line of a coil conductor 4 is shown. The upper part of the figure shows a coil pattern of the main gradient magnetic field coil 2, and the lower part of the figure shows a coil pattern of the gradient magnetic field shield coil 3. In the right half of the main gradient magnetic field coil 2, another type of gradient magnetic field shield coil 8 with the gradient magnetic field shield coil 3 stacked thereon is written. A portion indicated by an "x" mark in the figure indicates a connecting part 7 of the main gradient magnetic field coil 2 and the gradient magnetic field shield coil 3.

The calculation method in accordance with the embodiment allows terminals of each coil to be concentrated in a predetermined area. In the dotted area, current potentials are negative. The gradient magnetic field shield coil 3 is in this area. Referring to this figure, the center of the winding of the gradient magnetic field shield coil 3 has the lowest current potential value, and the current path of the gradient magnetic field shield coil 3 is wound in the reverse direction of that of the main gradient magnetic field coil 2.

Figure 6:
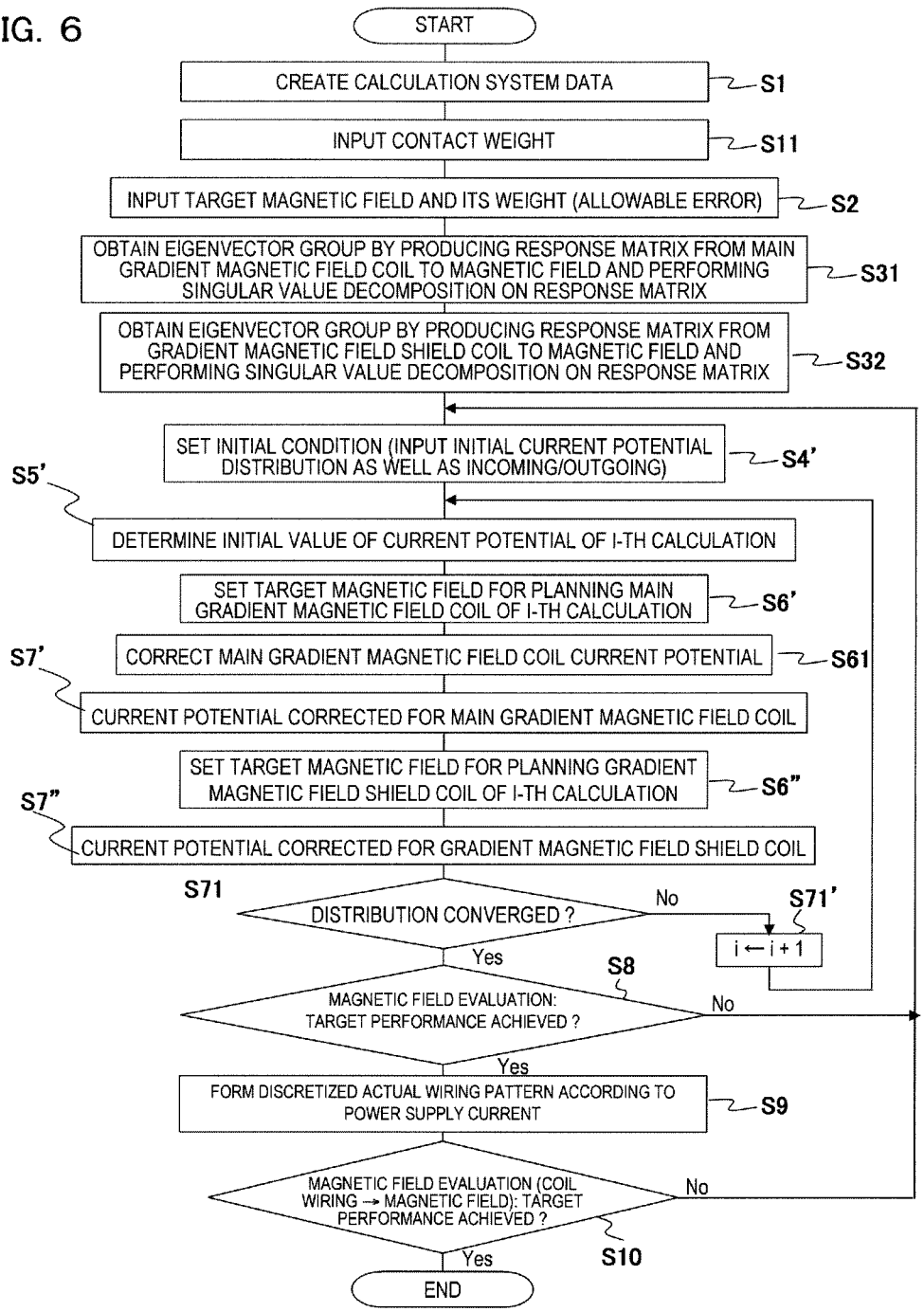
FIG. 6 A flowchart for describing a process of the coil pattern calculation method.

We calculated the magnetic field generated by the entire gradient magnetic field coil by symmetrically expanding the one quarter area, and calculated the current path so that the target magnetic field is obtained, according to the above-described flowchart (see FIG. 6).

As described above, the gradient magnetic field coil was divided into the main gradient magnetic field coil 2 and the gradient magnetic field shield coil 3, and a coil pattern was calculated for each of them. These two coils are connected to each other at a portion of the outermost circumference part with a size similar to the radius. First, a current potential was determined for the area around the connecting part 7 as an initial value. We decided not to optimize this area for the target magnetic field. In other words, we assumed that the magnetic field generated by the initial value for the area around the connecting part 7 had already existed and then we determined a current distribution for the remaining areas.

For this reason, the coil pattern in the area around the connecting part 7 is a pattern that is generally a combination of straight lines.

In this example, the connecting part 7 is provided in the middle between the maximum outside diameter and the minimum outside diameter with respect to the center of the plate type gradient magnetic field coil 1 (the origin of this chart). Specifically, the connecting part 7 is located at a smaller radius position than that of the edge in the magnetic field gradient direction (X direction for X-GC) of the gradient magnetic field shield coil 8 located at the longest distance from the center (at the largest radius in polar coordinates), and, on the other hand, is located at a larger radius position than that of the edge in the magnetic field gradient direction of the main gradient magnetic field coil 2 located at the smallest radius position.

In conventional calculation method, the connection point cannot be determined freely in the entire calculation, so the positional relationship between the connection point and the remaining coil portion cannot be adjusted. In this case, the connecting part may structurally interfere with other coils such as shield coil or main coil. However, when the connection point can be adjusted according to the embodiment, a leakage magnetic field can be decreased by adjusting the positional relationship in the gradient direction between the main gradient magnetic field coil 2 and the gradient magnetic field shield coil 3, and the main gradient magnetic field coil 2 can be connected to the gradient magnetic field shield coil 3 without structurally interfering with other coils.

Figure 8:
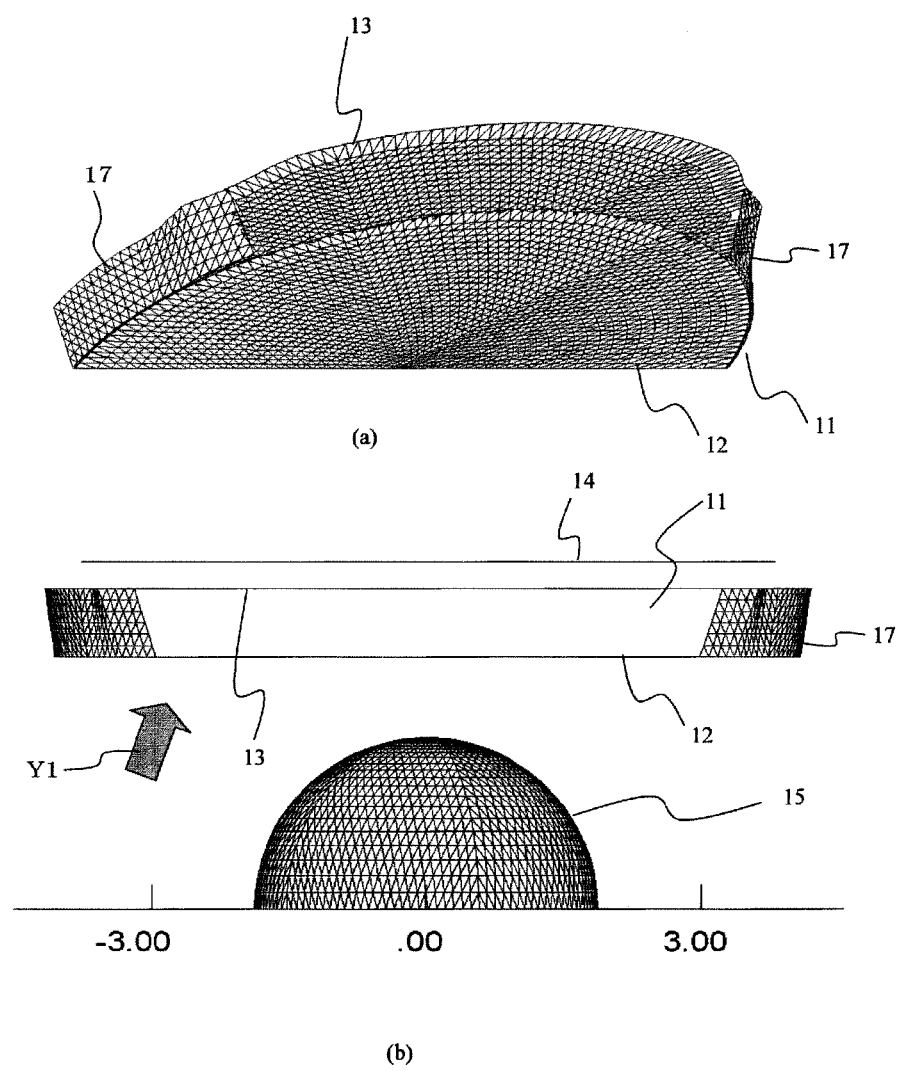
FIGS. 8(a) and 8(b) A diagram for describing a calculation system.

Here, FIG. 7 is the determined coil pattern, and, as a preparation of this determination, we provided a calculation system shown in FIG. 8. Considering Y-GC, FIG. 8(b) shows this calculation system viewed from Y direction. A hemisphere shown in the bottom of the figure indicates a magnetic field evaluating field 15 of the imaging field. A surface above a calculation model 11 of the gradient magnetic field coil is a leakage magnetic field-into-magnet evaluating surface 14. A system shown in FIG. 8(a) is the curved surface on which the gradient magnetic field coil pattern is to be determined, viewed from the direction of an arrow Y1 shown in FIG. 8(b). The calculation model 11 includes a gradient magnetic field shield coil calculation model 13 and a main gradient magnetic field coil calculation model 12. A three-dimensionally disposed connecting part calculation model 17 connected to the gradient magnetic field shield coil calculation model 13 is attached to both sides of the main gradient magnetic field coil calculation model 12. The calculation system is for one quarter of the entire space, which can be symmetrically expanded to the entire space (only half of the calculation system is shown).

The three-dimensionally disposed connecting part calculation model 17 is disposed on the side surface, but is not disposed on the front surface. On the front surface, a connecting part in which three-dimensional current for another gradient magnetic field coil (X-GC) flows is to be disposed. Unlike the conventional methods, according to the coil pattern calculation method in accordance with the embodiment, even though a hole exists in a surface like the above, current circulating around the hole (three-dimensional current) can be represented.

Figure 9:
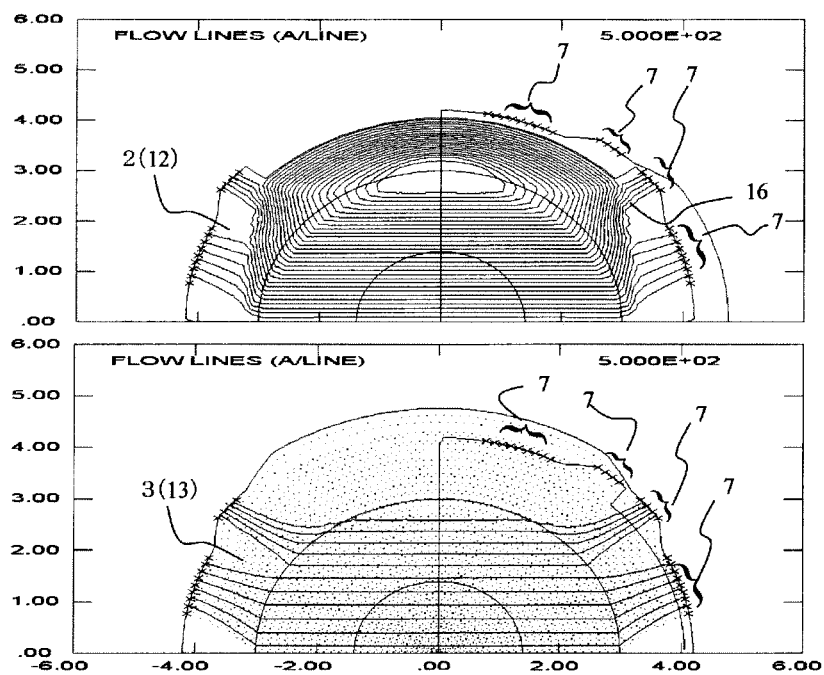
FIG. 9 A diagram showing an initial current potential distribution in the calculation for determining a coil pattern using the coil pattern calculation method in accordance with an embodiment of the invention.

FIG. 9 shows a state in which a current potential initial value indicated by current potential contour lines 16 is set for the gradient magnetic field coil curved surface of the calculation system shown in FIG. 8. The contour lines are shown in 500 A steps. As with the gradient magnetic field coil shown in FIG. 7, two patterns of the main gradient magnetic field coil 2 (calculation model 12, the same hereinafter) and the gradient magnetic field shield coil 3 (calculation model 13, the same hereinafter) are shown. Although the initial value is not unique, the connecting part 7 three-dimensionally connecting the main gradient magnetic field coil 2 to the gradient magnetic field shield coil 3 forces the current potential values of both coil edges to be the same so as to position the connection conductor. With this capability of forcibly positioning the connecting part 7, the patterns of the main gradient magnetic field coil 2 and the gradient magnetic field shield coil 3 can be separately calculated, so the error magnetic field for the magnetic field of the imaging field and the error magnetic field for the leakage magnetic field into the magnet can be reduced according to their respective required accuracies.

By the way, the gradient magnetic field of the imaging field allows an error of several gausses, whereas the leakage magnetic field needs to be an error of about 0.1 gauss or less because it applies electromagnetic force to a coil having a large magnetomotive force of several MAT. Trying to optimize portions having different required accuracies as described above with one calculation at a time may not be able to meet their respective required accuracies, causing an excessively complicated pattern to arise by calculation.

In FIG. 9, as a current potential initial value, for the gradient magnetic field shield coil 3, a current potential only interpolated from the current potential of the connecting part 7 was input. On the other hand, for the main gradient magnetic field coil 2, a distribution close to the current potential distribution of X-GC (or Y-GC) to be determined was input. Setting the initial value to a distribution close to a final solution as above provides good convergence and avoids causing an excessively complicated pattern to arise.

Figure 10:
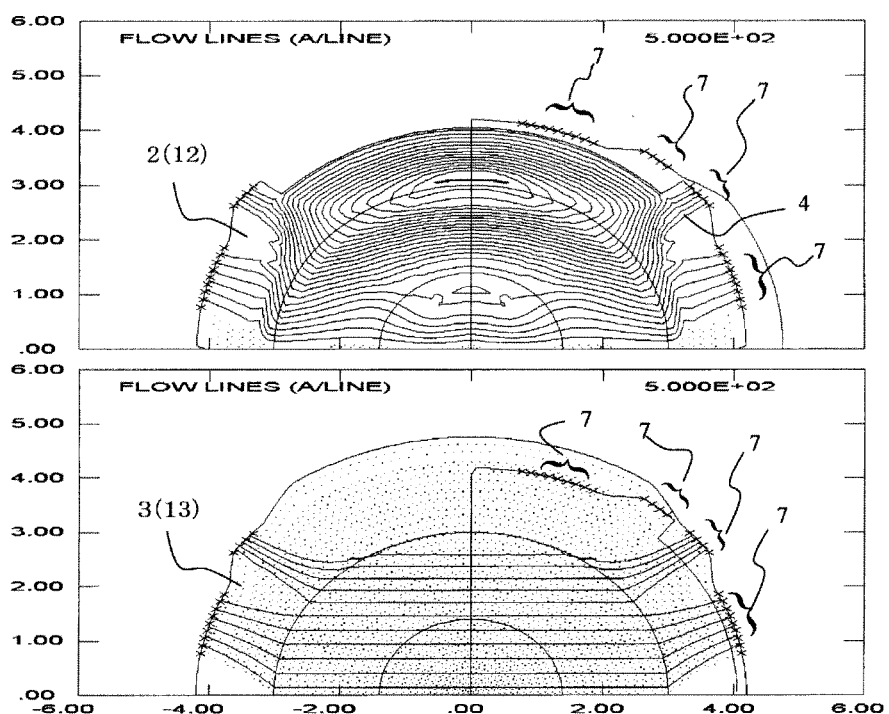
FIG. 10 A diagram showing a current potential distribution after one approximate calculation of the current potential of a main gradient magnetic field coil is performed for a static magnetic field of an imaging field.

FIG. 10 shows a current potential distribution at one step ahead from the initial value in the repeated calculation. This is a result of calculating the first main gradient magnetic field coil current potential so that a required magnetic field is generated in the imaging field, by considering the magnetic field the gradient magnetic field shield coil 3 generates in the main gradient magnetic field coil 2. As seen, in the main gradient magnetic field coil 2, the pattern has changed from the initial value, but, around the connecting part 7, the linear pattern is preserved. Also, the calculation has not proceeded yet to the gradient magnetic field shield coil 3. After the calculation for the main gradient magnetic field coil 2, the pattern of the gradient magnetic field shield coil 3 is calculated. This repeated calculation is performed until convergence (until a large change in current potential is eliminated by the repeated calculation).

Figure 11:
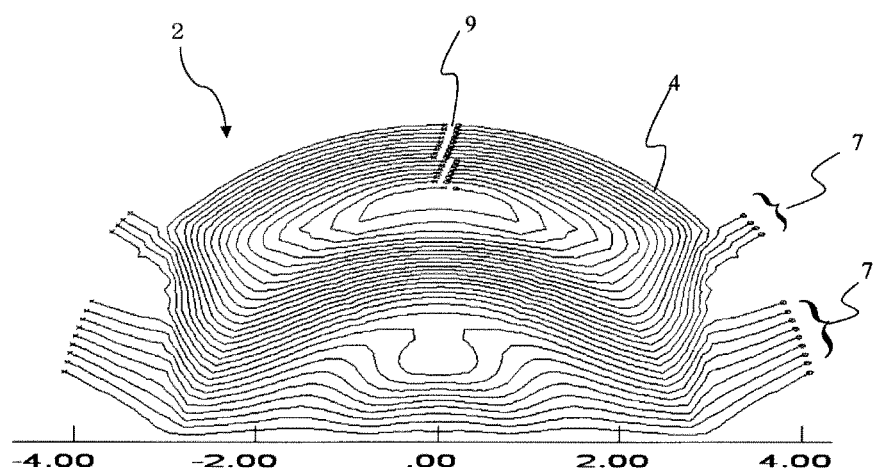
FIG. 11 A diagram showing a discretized coil pattern of the main gradient magnetic field coil.

This repeated calculation converges to the current potential distribution of the gradient magnetic field coil as shown in FIG. 7. In this Figure, the contour lines indicate the coil shape. In practice, a connection stage needs to be provided between turns, and a discretized coil pattern is applied to the gradient magnetic field coil as shown in FIG. 11. FIG. 11 shows the main gradient magnetic field coil 2. Also in this figure, a portion of the pattern near the connecting part 7 connecting to the gradient magnetic field shield coil 3 (see FIG. 7) is linear. The coil conductor 4 is indicated by a center line, but some upper portion is connected to nothing (or is open). This portion is stepwise connecting part 9.

Figure 12:
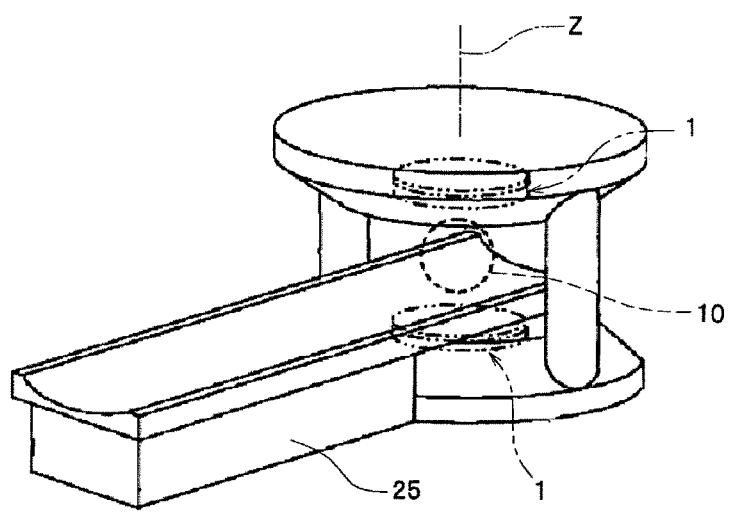
FIG. 12 A schematic diagram showing a nuclear magnetic resonance imaging apparatus to which the gradient magnetic field coil in accordance with an embodiment of the invention is applied.

The gradient magnetic field coil having the pattern thus determined is used for three directions, which are combined into one gradient magnetic field coil 1 that is combined with an open-type electromagnet device (magnet) to be configured as a nuclear magnetic resonance imaging apparatus as shown in FIG. 12. This is further combined with a bed 25 on which a subject lies to be used for diagnostic imaging.

Now, the effects of introducing this characteristic calculation method are described in order.

Introducing the weighting described in (4-1) allows an area in which a coil pattern may be complicated to be tuned. Specifically, for an area in which a wiring such as connection needs to be provided, laying out a complicated pattern can be avoided, and a minimum amount of curved patterns with a small radius of curvature, such as a linear pattern, can be laid out.

This can facilitate the fabrication. The gradient magnetic field allows, for example, five percent or so of deviation from a linear magnetic field distribution ($B=\alpha X$ for X-GC: $\alpha$ is a proportional constant). Accordingly, this allowable error may be utilized for arbitrarily laying out a linear pattern described above or the like.

Introducing the outgoing/incoming current described in (4-2) into the calculation allows the positions of current terminals of the coil to be considered in the calculation. Also, for dividing an region as described in (4-3), the positions of current terminals need to be considered also in order to connect the divided subregions.

Furthermore, introducing the method of repeating until convergence the steps of dividing the region for the calculation into subregions and alternately calculating a coil pattern for each subregion, described in (4-3) allows the coil pattern to be calculated with respective required accuracies for the magnetic field of the imaging field and the shielding capability.

In calculating the coil pattern by dividing into subregions, since a required magnetic field accuracy is different for each subregion, calculating the coil pattern at one time without dividing into the subregions makes it difficult to calculate the coil pattern for each subregion with its required accuracy.

Thus, according to the invention, the region for the calculation is divided into subregions and the coil pattern is alternately and repeatedly calculated for each subregion.

As shown in FIG. 5, the gradient magnetic field coil 1 generally includes the main gradient magnetic field coil 2 and the gradient magnetic field shield coil 3. The main gradient magnetic field coil 2 allows several percent of error for the target magnetic field.

On the other hand, in order that any magnetic field interfering with imaging may not be generated due to eddy current in an area opposite to the imaging field 10 in which a coil or other structures exist, the gradient magnetic field shield coil 3 requires high accuracy so that a static magnetic field generated by a given main coil reaching the area will be almost zero (about 0.1% or less compared to the magnetic field in the imaging field 10).

Thus, for such a difference in required magnetic field accuracy, the gradient magnetic field coil 1 is divided to two regions of the main gradient magnetic field coil 2 and the gradient magnetic field shield coil 3, and calculating the coil pattern is repeated for each region (for each coil), allowing the coil pattern to be calculated with respective required accuracies ensured for the magnetic field formed in the imaging field 10 and the shielding capability.

Also, the calculation may be performed separately on a first area (an area except a linear portion of the edge of the coil) in which the current potential value will be changed with respect to the target magnetic field in the repeated calculation, and a second area (the area of the linear portion of the edge of the coil) in which the current potential value will be changed by the amount of change smaller than that for the first area or will not be changed. Thus separated calculation allows the linear coil pattern to be preserved at the edge of the coil and the gradient magnetic field coil having the coil pattern facilitating the fabrication to be obtained.

Now, advantages of the embodiment are described.

(A) As described above, according to the coil pattern calculation method in accordance with the embodiment, the main gradient magnetic field coil 2 and the gradient magnetic field shield coil 3 having coil patterns for which their respective required magnetic field accuracies are considered can be obtained. The coil pattern around the connecting part 7 can be a pattern facilitating the fabrication according to a designer's intention, which can provide a lightweight and low-cost gradient magnetic field coil and an MRI apparatus including the coil without degrading the magnetic field performance.

(B) In the main gradient magnetic field coil 2 and the gradient magnetic field shield coil 3 formed with the coil pattern obtained through the coil pattern calculation method in accordance with the embodiment, the wiring between them and the pattern around their connecting part (the pattern of the portion connected to two or more wirings in the edge of the coil pattern) can be a linear wiring or linear coil pattern, which improve the connectivity of the wiring and facilitates the fabrication.

(C) The coil pattern can be designed by considering net current (three-dimensional current) circulating between the main gradient magnetic field coil 2 and the gradient magnetic field shield coil 3. This allows the performance required for the gradient magnetic field coil 1 to be met and also allows the coil pattern facilitating the fabrication and with no limitation on its shape (for example, an opening can be provided) to be designed.

(D) The gradient magnetic field coil 1 with any outer shape can be designed by making a surface on which the coil pattern is planned using finite surface elements. In other words, the outer shape is determined with a higher priority given to generating a homogeneous magnetic field with a magnet for generating a static magnetic field, and the required coil pattern can be designed according to any shape of a space given for the gradient magnetic field.

(E) The outer shape of the gradient magnetic field coil can be fit to the magnet of the MRI apparatus, so the entire apparatus can be compact, which can give open feeling to a subject.

Figure 13:
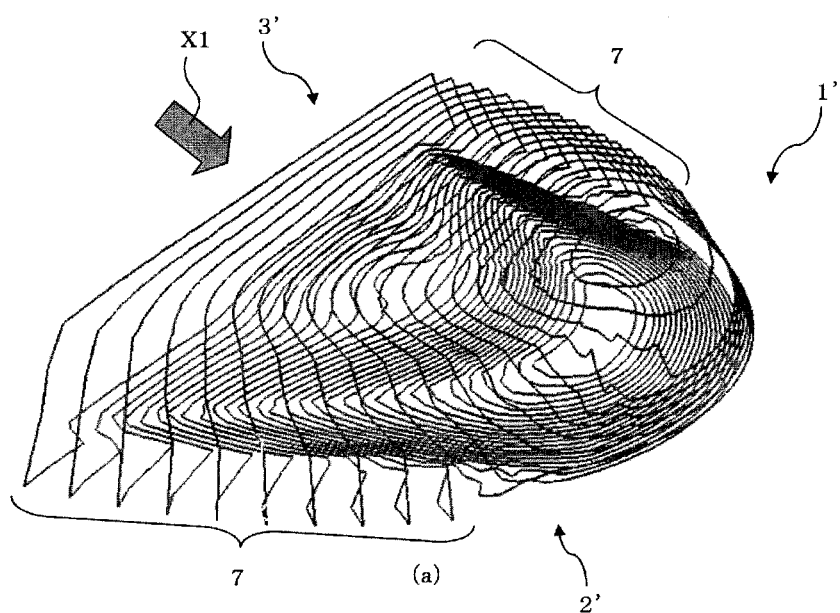
FIGS. 13(a) and 13(b) A diagram showing another example of the coil pattern.
Figure 13:
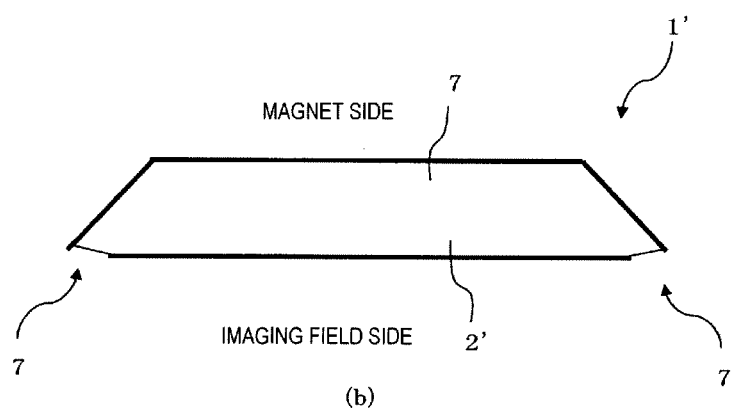
Figure 14:
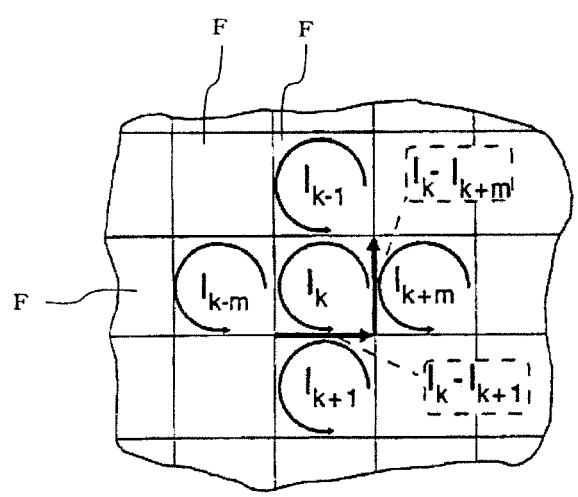
FIGS. 14(a) and 14(b) A diagram illustrating a conventional art.
Figure 14:
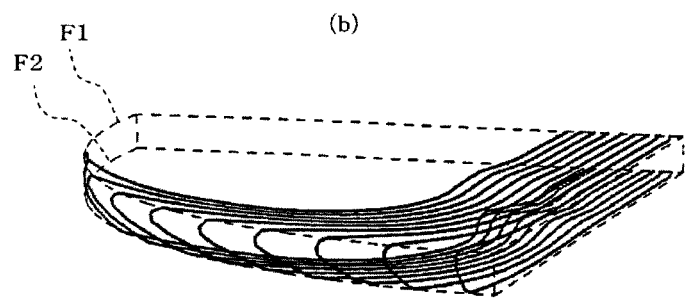
Figure 15:
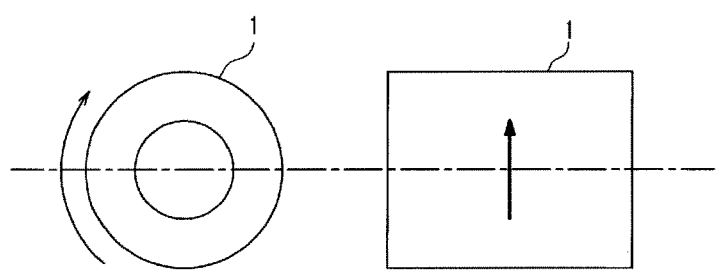
FIG. 15 A diagram illustrating a conventional art.

FIGS. 13(a) and 13(b) schematically show another gradient magnetic field coil 1'. As with the above, a center line of the conductor of X-GC (or Y-GC) is shown with one quarter of the entire system. FIG. 13(b) shows the outer shape of the gradient magnetic field coil viewed from the direction of an arrow X1 shown in FIG. 13(a). The gradient magnetic field coil 1' includes a main gradient magnetic field coil 2' and a gradient magnetic field shield coil 3'. As seen, the connecting part 7 and its surroundings are configured by combining linear conductors. This configuration can be formed using the coil pattern calculation method in accordance with the embodiment, and can reduce magnetic field leaking into the surroundings by employing an umbrella shape as a whole.

The invention claimed is:

1. A coil pattern calculation method, performed by a coil pattern calculation apparatus, for calculating, based on one or more target magnetic fields, a coil pattern of a coil having an entire coil surface that is divided into two or more coil surfaces, the coil pattern calculation method comprising the steps of:
(a) calculating a current potential at each contact between finite surface elements forming each of the coil surfaces based on an initial value of an input current potential distribution;
(b) for each of the coil surfaces, repeatedly calculating the current potential alternately and, under each magnetic field condition, determining a current potential distribution that generates a magnetic field falling within the range of allowable error for each target magnetic field so that a surface current represented by the current potential will become close to the target magnetic field distribution set for each of the finite surface elements; and
(c) determining the coil pattern of the coil from the contour lines of the determined current potential distribution,
wherein the coil configured to have the coil pattern determined in (c) generates a target magnetic field when a current is passed through the coil.

2. The coil pattern calculation method according to claim 1, characterized in that the step of determining the current potential distribution includes the steps of:
using a response matrix from the current potential to the target magnetic field distribution, adding a weight to the current potential at the each contact, changing a current potential value with respect to the target magnetic field in the repeated calculation, and dividing the coil surfaces into a first area in which the amount of change is adjusted according to the distribution of the weight, and a second area in which the current potential value will be changed by the amount of change smaller than that for the first area or will not be changed; and
calculating the first and second areas separately according to the weighting.

3. The coil pattern calculation method according to claim 1, characterized in that
the coil surfaces include a coil surface forming a main coil and a coil surface forming a shield coil; and
the step of determining the current potential distribution includes the step of:
allocating an initial current potential distribution corresponding to current flowing through the main coil, the shield coil and their connecting part to the each contact of the finite surface elements, and calculating the current potential value allocated to the connecting part and its surroundings by changing the current potential value by the amount of change during the repeated calculation smaller than that for the remaining portion to represent current circulating between the coil surfaces of the main coil and the shield coil at the connecting part.

4. The coil pattern calculation method according to claim 3, wherein the coil includes wirings connecting the main coil to the shield coil, and one or more of the wirings is linear.

5. The coil pattern calculation method according to claim 4, wherein
each of the main coil and the shield coil has a disc shape, and
the wirings are provided centered to a certain area in a circumference direction.

6. The coil pattern calculation method according to claim 4, wherein the wirings connect the main coil to the shield coil at the middle between the maximum outside diameter and the minimum outside diameter of the main coil and the shield coil.

7. A gradient magnetic field coil configured with a coil pattern calculated using the coil pattern calculation method according to claim 1, characterized by a main gradient magnetic field coil for applying a linear magnetic field distribution to add location information to a nuclear magnetic resonance signal and creating a linear magnetic field distribution in a imaging area, and a gradient magnetic field shield coil located opposite to the main gradient magnetic field coil with respect to the imaging field and for suppressing magnetic field leaking into a magnet for generating a homogeneous static magnetic field, and characterized in that:

the gradient magnetic field coil includes wirings connecting the main gradient magnetic field coil to the gradient magnetic field shield coil; and any of the wirings is linear.

8. The gradient magnetic field coil according to claim 7, characterized in that, in the coil pattern formed into the main gradient magnetic field coil and the gradient magnetic field shield coil, the pattern of the portion connected to the wirings at the edge of the coil pattern is linear.

9. The gradient magnetic field coil according to claim 7, characterized in that:

each of the main gradient magnetic field coil and the gradient magnetic field shield coil has a disc shape; and the wirings are provided centered to a certain area in a circumference direction.

10. The gradient magnetic field coil according to claim 7 characterized in that the wirings connect the main gradient magnetic field coil to the gradient magnetic field shield coil at the middle between the maximum outside diameter and the minimum outside diameter of the main gradient magnetic field coil and the gradient magnetic field shield coil.

11. A magnetic resonance imaging apparatus comprising the gradient magnetic field coil according to claim 7.

12. A coil pattern calculation method, performed by a coil pattern calculation apparatus, for calculating, based on one or more target magnetic fields, a coil pattern of a coil having an entire coil surface that is divided into two or more coil surfaces, the coil pattern calculation method comprising:

a calculation step of calculating a current potential at each contact between finite surface elements forming each of the coil surfaces based on an initial value of an input current potential distribution;

an evaluation step for evaluate whether or not a magnetic field based on the current potential falls within a range of allowable error for a target magnetic field set for each of the finite surface elements; and a determination step for, if evaluated that the magnetic field falls within the range of allowable error, determining the coil pattern of the coil from a current potential distribution based on the current potential, wherein the coil configured to have the coil pattern determined in the determination step generates a target magnetic field when a current is passed through the coil.

13. A coil pattern calculation method, performed by a coil pattern calculation apparatus, for calculating, based on one or more target magnetic fields, a coil pattern of a coil having an entire coil surface that is divided into two or more coil surfaces, the coil pattern calculation method comprising:

a calculation step of calculating a current potential at each contact between finite surface elements forming each of the coil surfaces based on an initial value of an input current potential distribution;

a evaluation step for evaluate whether or not a magnetic field based on the current potential falls within a range of allowable error for a target magnetic field set for each of the finite surface elements; and a determination step for, if evaluated that the magnetic field does not fall within the range of allowable error, repeating the calculation step and the evaluation step until the magnetic field falls within the range of allowable error, and determining the coil pattern of the coil from a current potential distribution based on the current potential falling within the range of allowable error, wherein the coil configured to have the coil pattern determined in the determination step generates a target magnetic field when a current is passed through the coil.

\* \* \* \* \*